United States Patent
Hardikar et al.

(10) Patent No.: US 8,261,758 B2
(45) Date of Patent: Sep. 11, 2012

(54) APPARATUS AND METHOD FOR CLEANING AND REMOVING LIQUIDS FROM FRONT AND BACK SIDES OF A ROTATING WORKPIECE

(75) Inventors: Vishwas Hardikar, Campbell, CA (US); Kevin Bertsch, Tigard, OR (US); Migdad Selimovic, Tigard, OR (US)

(73) Assignee: Novellus Systems, Inc., San Jose, CA (US)

(*) Notice: Subject to any disclaimer, the term of this patent is extended or adjusted under 35 U.S.C. 154(b) by 1708 days.

(21) Appl. No.: 11/506,373

(22) Filed: Aug. 17, 2006

(65) Prior Publication Data

US 2008/0041423 A1 Feb. 21, 2008

(51) Int. Cl.
*B08B 3/00* (2006.01)
(52) U.S. Cl. ...................... 134/94.1; 134/902
(58) Field of Classification Search .................. None
See application file for complete search history.

(56) References Cited

U.S. PATENT DOCUMENTS

| | | |
|---|---|---|
| 5,571,337 A | 11/1996 | Mohindra et al. |
| 5,634,978 A | 6/1997 | Mohindra et al. |
| 5,878,760 A | 3/1999 | Mohindra et al. |
| 5,958,146 A | 9/1999 | Mohindra et al. |
| 6,158,446 A | 12/2000 | Mohindra et al. |
| 6,928,751 B2 * | 8/2005 | Hosack et al. ............ 34/594 |

FOREIGN PATENT DOCUMENTS

JP 11031643 A * 2/1999

OTHER PUBLICATIONS

Sato, Kichizo, Oct. 1997, JP 11-031643, English machine translation.*

* cited by examiner

*Primary Examiner* — Michael Barr
*Assistant Examiner* — Jason Ko

(57) ABSTRACT

An apparatus for simultaneously rinsing and drying front and back surfaces of a workpiece comprises a chuck adapted to spin the workpiece, a plurality of posts coupled to the chuck and adapted to support the workpiece, and first and second mechanical arms. The first mechanical arm is adapted to be positioned between the chuck and the workpiece, and to sweep along at least part of the workpiece back surface. The first mechanical arm comprises at least a first rinsing liquid nozzle, and a first tensioactive vapor nozzle. The second mechanical arm is adapted to be positioned adjacent to the workpiece front surface, and to sweep along at least part of the workpiece front surface. The second mechanical arm comprises at least a second rinsing liquid nozzle, and a second tensioactive vapor nozzle.

11 Claims, 5 Drawing Sheets

APPARATUS AND METHOD FOR CLEANING AND REMOVING LIQUIDS FROM FRONT AND BACK SIDES OF A ROTATING WORKPIECE

TECHNICAL FIELD

The present invention generally relates to an apparatus and method for removing a processing or rinsing liquid from a rotating substrate surface, and more particularly relates to an apparatus and method for removing such a liquid without allowing particles in the liquid to settle on the surface due to liquid evaporation or streaking.

BACKGROUND

During a typical semiconductor wafer fabrication process it is necessary to subject the wafer to a plurality of cleaning steps. Etching compounds, polishes, solvents, abrasives, and other chemicals used for deposition or polishing methods often leave residues on the wafer. Such contaminants can increase defectivity or deteriorate electrical performance of the wafer components, and are consequently rinsed or otherwise removed to clean the wafer. An effective wafer cleaning includes both of a thorough rinsing process and a quick drying process. Many benefits gained by an effective rinsing step can be lost if the drying step is not carefully carried out.

One common method for cleaning a semiconductor wafer is spin rinse drying, which involves mounting a wafer on a chuck and spraying the wafer with a cleaning solvent while the wafer is spinning. A desirable feature of spin rinse drying is the ability to dry each wafer individually and not in batches. Integrated circuits are commonly manufactured individually, with processing steps including implantation, deposition, etching, etc. performed on one substrate at a time. Spin rinse drying allows for the cleaning processes to be performed in line with the other processing steps, removing the need to wait for a certain number of wafers to be ready for combined cleaning.

Some spin rinse drying processes utilize the wind created during spinning to dry the cleaning liquid. Air drying the wafer surface in this manner is somewhat counterproductive because particulates that were dissolved in the liquid tend to remain on the wafer surface after the liquid evaporates. Also, streak marks are often left on the wafer surface when drying is performed in this manner. The wafer outer regions spin with a greater velocity than the wafer inner regions, and the wafer outer regions are consequently the first areas to dry. When a rotational force causes liquid to spread from the wafer inner areas over the dry outer surface, particulates in the liquid will sometimes create the streak mark.

One improved spin rinse drying apparatus is illustrated in FIGS. 1A and 1B. A wafer 10 rotates at a speed ω while a liquid 16 is delivered to the wafer surface through a dispense tube 12 that slowly moves from the substrate center towards the edge at a speed v. A second nozzle 14 is mounted on the trailing side of the liquid dispense tube 12. The second nozzle 14 dispenses a tensioactive vapor that reduces the liquid surface tension and creates a strong force, commonly referred to as the Marangoni force, tangential to the wafer surface. The interaction of the rotational force with the Marangoni force physically removes the liquid from the wafer surface instead of allowing the liquid to evaporate.

Although the method described above, combining the Marangoni force with rotational force, provides a cleaner wafer than a conventional spin drying process, there are still some inherent limitations that impede the production of a wafer that is substantially free of streak marks or other particulate residue. One such limitation is that the back-side of the wafer must still be dried by a conventional spin dry process after the front-side is dried with a combination of Marangoni and rotational forces. The high speeds used in back-side dry process may cause splash back of liquid droplets that may accumulate on the cell walls, and worse, onto the wafer front side. Splash back may be prevented by using a low speed process, but drying is inherently slow at low speeds.

Another limitation typically associated with spin drying is the relatively slow drying speed. Both the front and back sides of a wafer should be free of contaminants prior to use. Spin drying is typically performed with one side of the wafer being exposed to one or more rinse and dry nozzles, with the opposite side being supported by a spinning chuck and therefore inaccessible to the rinse and dry nozzles.

Accordingly, it is desirable to provide a rinsing and drying apparatus and method that enable removal of rinsing liquid and the particulates dissolved therein on both the front and back sides of a wafer simultaneously. In addition, it is desirable to provide a rinsing and drying apparatus and method that produces a wafer or other workpiece substantially free of particulates due to liquid streaking or evaporation residue. Furthermore, other desirable features and characteristics of the present invention will become apparent from the subsequent detailed description and the appended claims, taken in conjunction with the accompanying drawings and the foregoing technical field and background.

BRIEF SUMMARY

An apparatus is provided for simultaneously rinsing and drying front and back surfaces of a workpiece. The apparatus comprises a chuck adapted to spin the workpiece, a plurality of posts coupled to the chuck and adapted to support the workpiece, and first and second mechanical arms. The first mechanical arm is adapted to be positioned between the chuck and the workpiece, and to sweep along at least part of the workpiece back surface. The first mechanical arm comprises at least a first rinsing liquid nozzle, and a first tensioactive vapor nozzle. The second mechanical arm is adapted to be positioned adjacent to the workpiece front surface, and to sweep along at least part of the workpiece front surface. The second mechanical arm comprises at least a second rinsing liquid nozzle, and a second tensioactive vapor nozzle.

A method is also provided for simultaneously rinsing and drying front and back surfaces of a workpiece. While spinning the workpiece, the workpiece back surface is rinsed by sweeping at least a first rinsing-liquid nozzle, mounted on a first mechanical arm, along at least part of the workpiece back surface while dispensing a rinsing liquid from at least the first rinsing liquid nozzle. The spinning workpiece back surface is dried by sweeping at least a first tensioactive vapor nozzle, mounted on the first mechanical arm, along at least part of the workpiece back surface while spraying tensioactive vapor from at least the first tensioactive vapor nozzle. The spinning workpiece front surface is rinsed, during rinsing of the workpiece back surface, by sweeping at least a second rinsing liquid nozzle, mounted on a second mechanical arm, along at least part of the workpiece front surface while dispensing a rinsing liquid from at least the second liquid rinsing nozzle. The spinning workpiece front surface is dried by sweeping at least a second tensioactive vapor nozzle, mounted on the second mechanical arm, along at least part of the workpiece front surface while spraying tensioactive vapor from at least the second tensioactive vapor nozzle. Finally, a tensioactive vapor is sprayed onto an outer edge of the workpiece back side from a stationary tensioactive vapor nozzle after drying the workpiece back surface and while drying the spinning workpiece front surface.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1A:
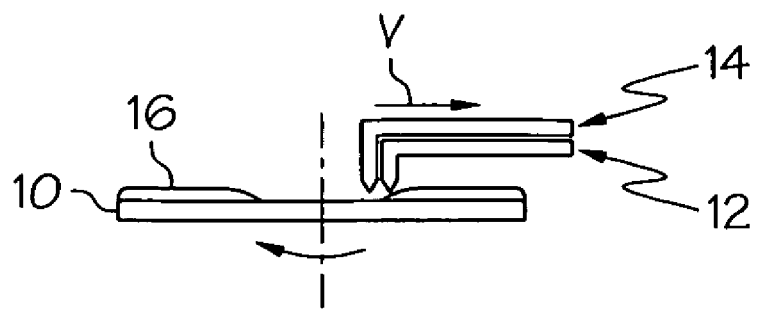
FIG. 1A is a cross-sectional view of a conventional spin rinse apparatus that utilizes a rinsing liquid along with a tensioactive vapor to clean a workpiece.
Figure 1B:
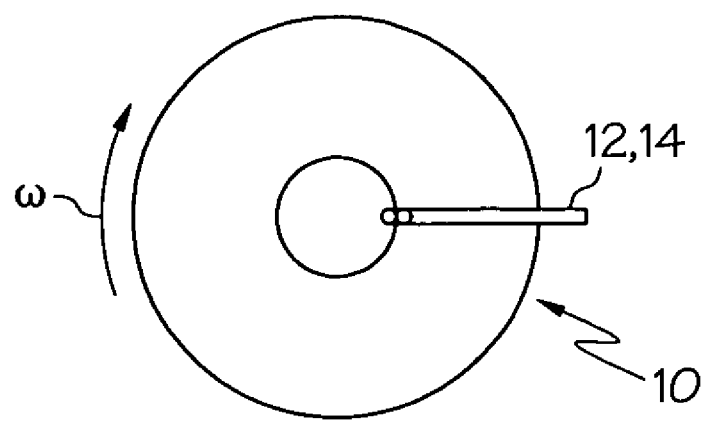
FIG. 1B is a top view of the apparatus illustrated in FIG. 1A.
Figure 2:
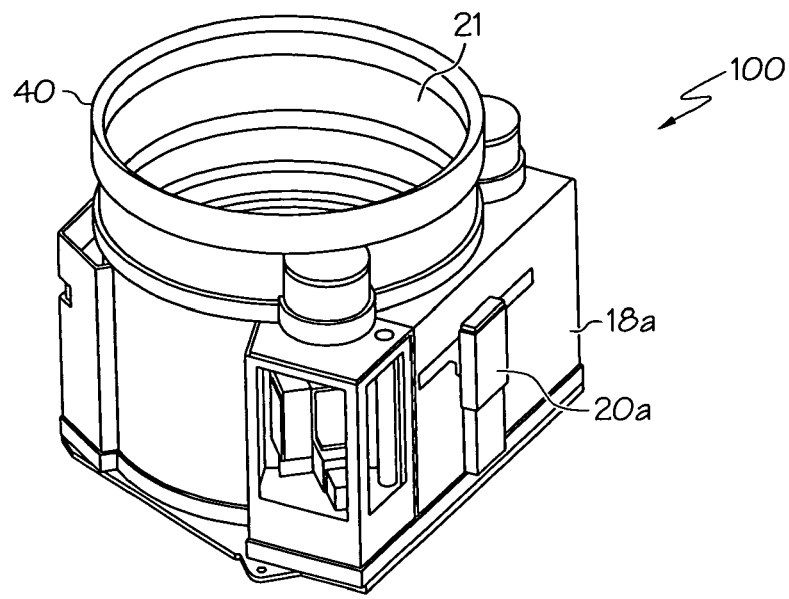
FIG. 2 is an isometric view of a workpiece cleaning apparatus according to an embodiment of the present invention.

Turning now to FIG. 2, a perspective view of a workpiece cleaning apparatus 100 is depicted according to an exemplary embodiment of the invention. The apparatus may be a stand-alone module, or it may be one of a plurality of cleaners incorporated into a multi-apparatus module. The other cleaners may be non-contact cleaners, meaning that the cleaners do not use brushes, pads, or other mechanical devices to contact a workpiece during cleaning. Contact cleaners such as conventional brush scrubbing cleaners may also be included, either in replacement of or in addition to non-contact cleaners.

The apparatus 100 includes a substantially cylindrical member 40 that is adapted to contain a workpiece, such as a semiconductor wafer, and components for cleaning the workpiece. The cylindrical member 40 has an inner surface 21 that is adapted to surround the workpiece during the cleaning operation. A front access door 18a is included with the apparatus 100 providing an entrance and exit port for a workpiece. For example, a robotic arm may transfer a workpiece from an adjacent cleaning, manufacturing, or processing apparatus into the cleaning apparatus 100 through the front access door 18a. Following completion of a cleaning operation using the apparatus 100, the robotic arm may transfer the workpiece out of the apparatus 100 using the front access door 18a or through a back access door. A front door actuator 20a is coupled to the front access door 18a and is further coupled to a non-illustrated processor configured to open and close the door 18a using the actuator 20a.

Figure 3:
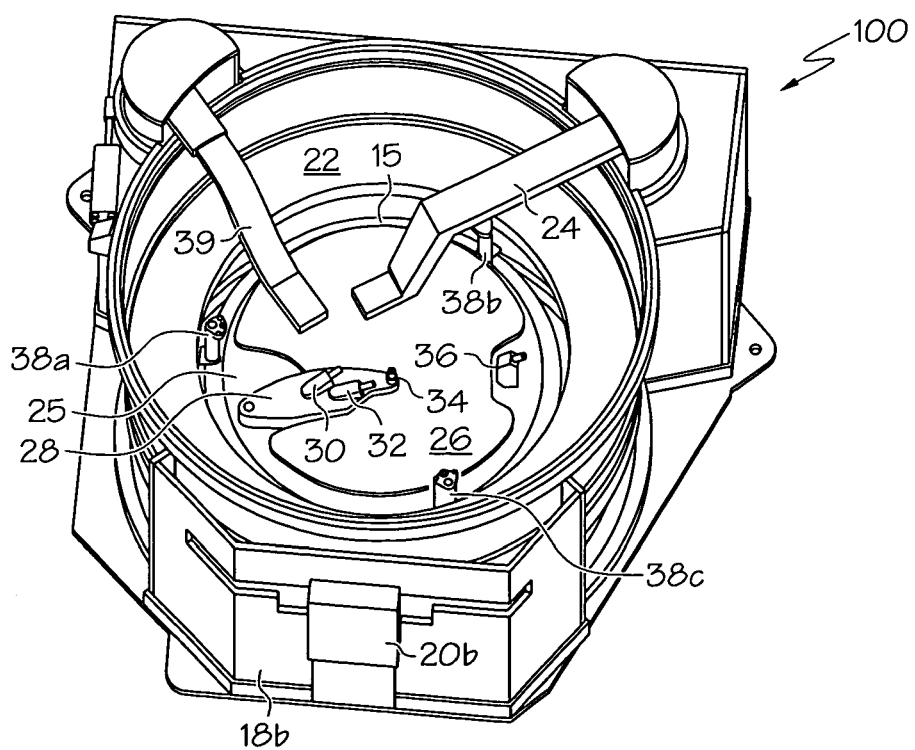
FIG. 3 is a top isometric view of the workpiece cleaning apparatus with a top wall depicted transparently for a detailed view of the various workpiece cleaning components included in the apparatus.

FIG. 3 is a top isometric view of the workpiece cleaning apparatus 100, with a top wall of the cylindrical member 40 depicted transparently to provide a detailed view of the various workpiece cleaning components contained inside the apparatus 100. In the illustrated embodiment, a rear access door 18b and a rear door actuator 20b are included, and operate in the same manner as the front access door 18a and door actuator 18b. Inside the apparatus is a chuck, which includes a rotor base platen 15 that spins and thereby rotates a workpiece during a cleaning operation. A plurality of posts 38a-c is mounted on the rotor base platen 15 to support the workpiece. A cleaning platform 25 on which cleaning components are supported is also included inside the apparatus 100. The cleaning platform and the associated cleaning components are not coupled to the chuck 15, and consequently remain stationary with respect to the rotating workpiece as it is being cleaned. A splash deflection plate 26 is mounted on the cleaning platform 25 to protect lower apparatus components from liquids that splash off the workpiece. A weir assembly 22 is also mounted inside the apparatus 100 for collecting sprayed fluids and directing them away from the workpiece. A first arm 28 is mounted on the cleaning platform 25. The arm 28 includes at least a workpiece edge wetting nozzle 30, a workpiece center wetting nozzle 32, and a tensioactive vapor spraying nozzle 34. An edge drying nozzle 36 is also mounted on the cleaning platform 25. The edge drying nozzle 36, together with the nozzles associated with the first arm 28, are for cleaning a first side of the workpiece, preferably the workpiece back side. A non-illustrated set of nozzles associated with the first arm, is mounted on a second arm 24 for cleaning an opposite side of the workpiece, preferably the workpiece front side. An additional arm 39 and other non-illustrated arms and/or nozzles may also be included to perform additional desired processes, including cleaning processes. For example, in an exemplary embodiment the additional arm is adapted and equipped to perform an etching process on the workpiece.

Figure 4:
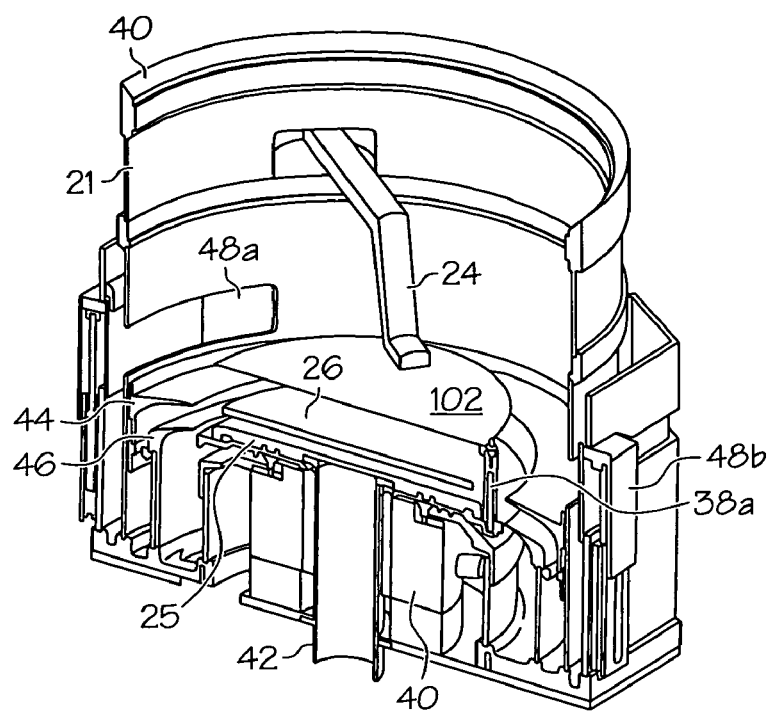
FIG. 4 is a cutaway perspective view of the workpiece cleaning apparatus.
Figure 5:
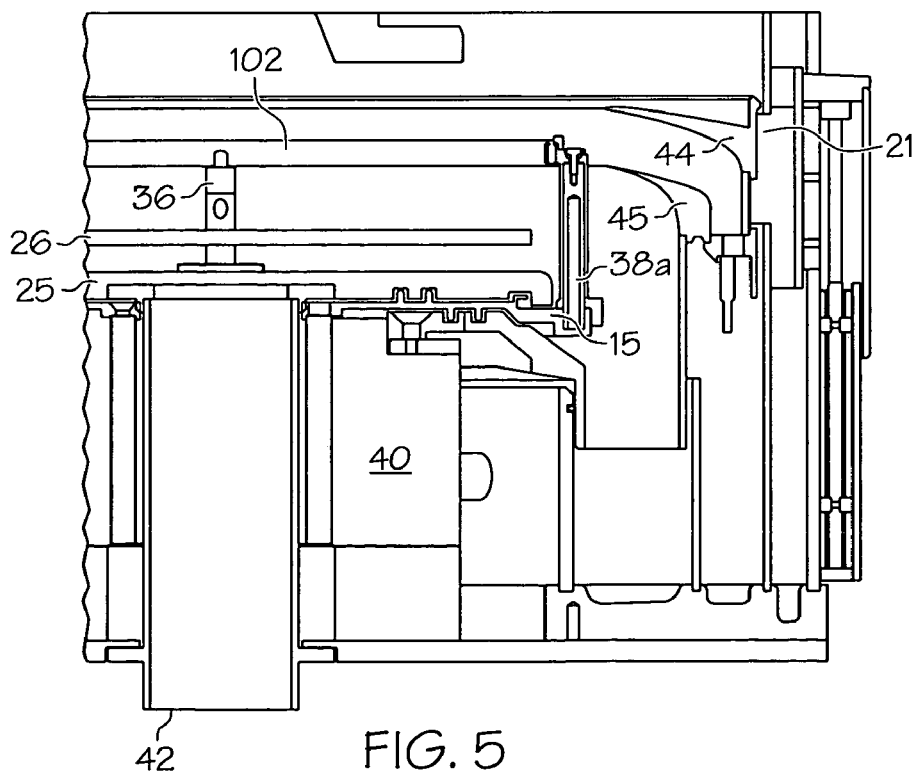
FIG. 5 is a partial cross-sectional view of the workpiece cleaning apparatus.

FIG. 4 is a cutaway perspective view of the apparatus 100, and FIG. 5 is a partial cross-sectional view of the apparatus 100, each enabling a different analysis of the apparatus components with reference to a workpiece 102, although some components are omitted from these figures in order to clearly depict other components. FIG. 4 depicts the workpiece 102 situated in the apparatus in an entrance or exit configuration. In the illustrated embodiment, the apparatus 100 includes an entrance port 48a and an exit port 48b, and the workpiece 102 is situated in alignment with the ports 48a and 48b either immediately after entering, or immediately prior to exiting, the apparatus 100.

In FIG. 5, the workpiece 102 is situated in a lowered position for cleaning. In the illustrated embodiment, the apparatus 100 includes an upper weir assembly tier member 44 and a lower weir assembly tier member 45. Both tier members 44 and 45 include substantially ring shaped bodies, arranged in a stacked configuration with a vertical gap between the two. The upper tier member 44 is mounted to the cylindrical member inner surface 21 or is otherwise outwardly disposed with respect to the lower tier member 45 so that the vertical gap initially formed between the tier members 44 and 45 continues into a horizontal gap. During a cleaning operation, cleaning fluids spray from the workpiece 102 toward the vertical gap between the tier members 44 and 45 and is captured into the horizontal gap. The upper tier member 44 includes a lower concave surface, and the lower tier member 45 includes an upper convex surface. The curved surfaces divert water sprayed from the workpiece 102 into the horizontal gap and also prevent backsplash onto the workpiece 102.

Figure 6:
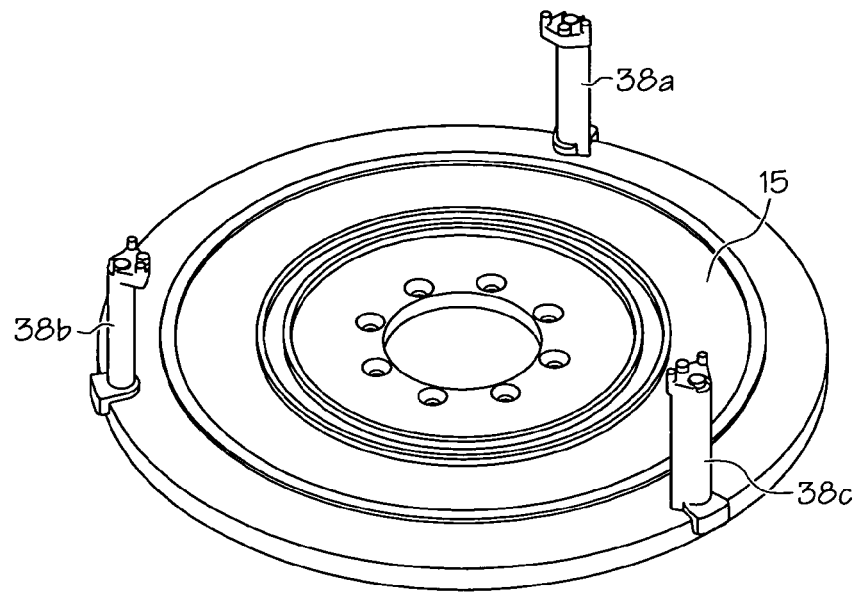
FIG. 6 is a perspective view of a rotor assembly included in the workpiece cleaning apparatus.

As previously discussed, the apparatus 100 includes a chuck that spins and thereby rotates the workpiece during a cleaning operation. The chuck includes the rotor base platen 15 and a rotating motor 40 on which the platen 15 is mounted. The motor 40 is cylindrical and surrounds a supporting rod 42 that extends above the platen 15 to mount the cleaning platform 25 on which the various cleaning components are supported. The supporting rod 42, the splash deflection plate 26, the cleaning platform 25, and the various cleaning components supported thereon do not rotate with the motor 40 and the platen 15. FIG. 6 is a perspective view of the platen 15, and provides a detailed view of the posts 38a-c that support the workpiece during a cleaning operation.

Figure 7:
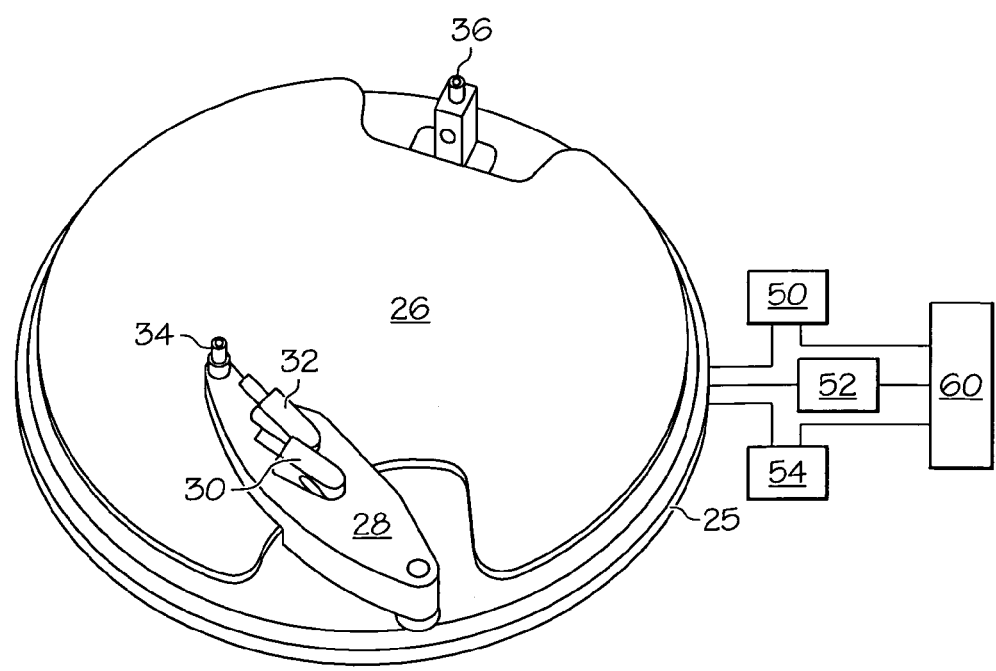
FIG. 7 is a perspective view of a back side cleaning assembly, including the various cleaning and drying nozzles, included in the workpiece cleaning apparatus.

Turning now to FIG. 7, the cleaning platform 25 is illustrated, together with the components supported thereon and associated supplying elements and a controller 60. As previously discussed, the first arm 28 is mounted on the cleaning platform 25, and includes at least the workpiece edge wetting nozzle 30, the workpiece center wetting nozzle 32, and the tensioactive vapor spraying nozzle 34. The edge drying nozzle 36 is also mounted on the cleaning platform 25. The edge drying nozzle 36, together with the nozzles associated with the first arm 28, are typically used for cleaning the workpiece back side. Each of the nozzles is coupled to a liquid and/or gas supply by way of a conduit such as a hose. According to an exemplary embodiment, the workpiece edge and center wetting nozzles 30 and 32 are coupled to a deionized (DI) water supply 50, which may be a single source or separate sources (i.e. supplies 50 and 54) for each of the wetting nozzles 30 and 32 in order to enable separate control of the flow rates and pressures for the DI water supplied to each of the wetting nozzles 30 and 32 using controller 60. Each of the wetting nozzles 30 and 32 is aimed to direct fluid toward the workpiece surface at a distribution angle between 5 and 45 degrees from the normal of the workpiece surface plane in an exemplary embodiment, and preferably between 10 and 20 degrees from the normal. In an exemplary embodiment, each of the drying nozzles 34 and 36 is aimed to direct tensioactive vapor toward the workpiece surface in a direction that is substantially perpendicular to the workpiece surface plane.

Both the tensioactive vapor spraying nozzle 34 and the edge drying nozzle 36 are coupled to a dry tensioactive vapor supply 52, which also may be a single source or separate sources (i.e. supply 54 may be a tensioactive vapor supply instead of a DI water supply) to enable separate control of flow rates and pressures for each of the drying nozzles 34 and 36 using the controller 60. An exemplary tensioactive vapor mixture is nitrogen gas with up to about 12% isopropyl alcohol (W?A) vapor, and other exemplary tensioactive compounds that can be vaporized and sprayed in a carrier gas using the drying nozzles 36 and 34 include ethyl acetate, acetone, and diacetone alcohol. The IPA and/or other tensioactive fluid concentration can be modified to meet the requirements of a particular rinsing process as long as the compound is miscible with the rinsing liquid and, when mixed with the rinsing liquid, yields a mixture having a surface tension that is lower than that of the rinsing liquid by itself.

The first arm 28 secures the nozzles 30, 32, and 34 and sweeps them along an arc between the workpiece center and the outer edge during a cleaning operation. The first arm 28, which preferably is used to clean the wafer back side, moves independent of the second arm 24. In an exemplary embodiment, the controller 60 is configured to control the independent and variable movements for the first and second arms 28 and 24. Furthermore, the sweeping motions for both of the arms 24 and 28 are controlled independently with respect to the rotation of the chuck and the platen 15 mounted thereon in order to optimize the nozzle positions on each side of the workpiece and to independently optimize the rate at which the workpiece is rotated.

Figure 8:
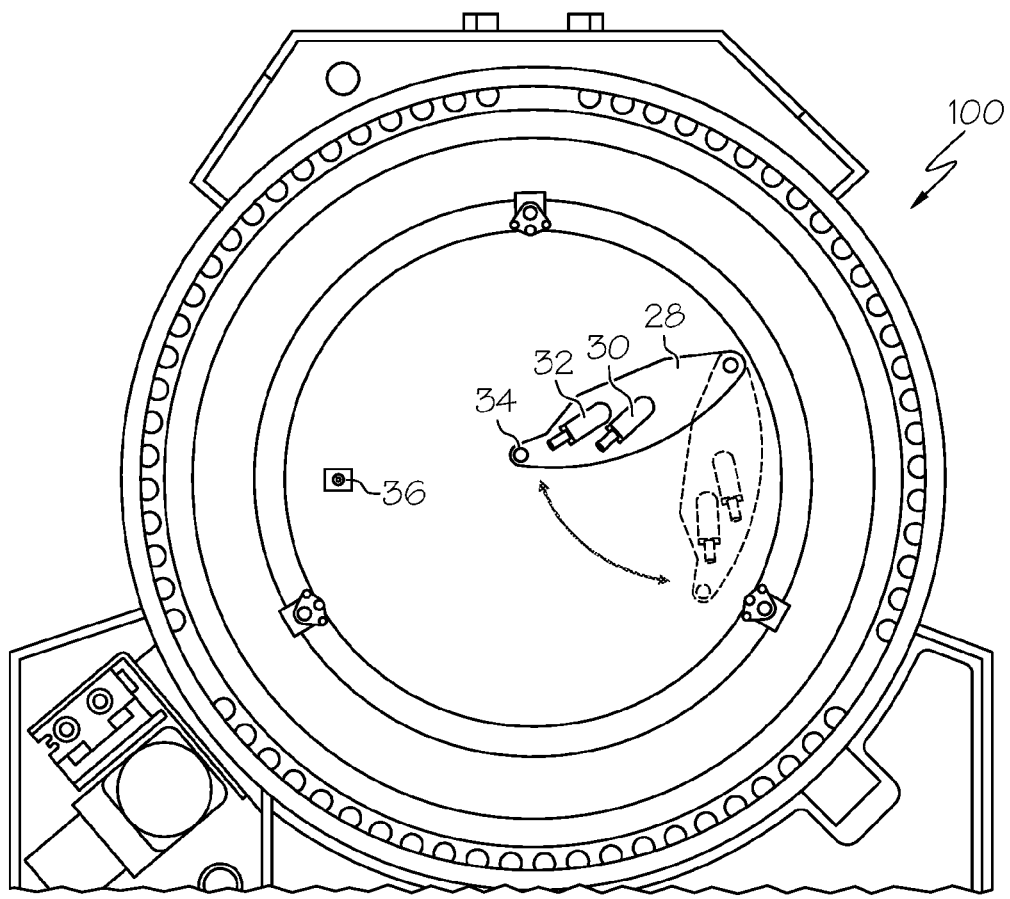
FIG. 8 is a top view of the workpiece cleaning apparatus and depicts movement of the cleaning and drying nozzles during a cleaning method.

A workpiece cleaning process is described next according to an exemplary embodiment of the invention, it being understood that numerous variations of the method are within the scope of the invention. FIG. 8 is a top view of the apparatus 100 and the workpiece backside cleaning assembly, including the cleaning and drying nozzles mounted on the first arm 28. The second arm 24, which is not depicted in FIG. 8, includes all of the cleaning and drying nozzles included on the first arm 28, but does not necessarily include an edge drying nozzle 36 as will be explained in detail. During the cleaning operation, each of the first and second arms 24 and 28 begins in the position depicted in FIG. 8 with the center wetting nozzle 32 spraying toward the workpiece center, and then moves in an arc traversing the workpiece radius along the pathway represented by the arrow. The tensioactive vapor spraying nozzle 34 on the first arm 28 directs the tensioactive vapor onto the workpiece surface at a substantially perpendicular angle with respect to the workpiece surface, beginning at the workpiece center. The tensioactive vapor immediately forces rinsing liquid from the area being sprayed with the dry vapor, creating a circular liquid-vapor boundary as the workpiece rotates. The workpiece is dry inside the circle created by the liquid-vapor boundary, and the circle increases in diameter as the tensioactive vapor spraying nozzle 34 moves toward the workpiece outer edge until the workpiece is entirely dried.

To begin the cleaning process, the first arm 28 begins traversing along the workpiece back side radius along the pathway represented by the arrow depicted in FIG. 8 before the second arm 24 begins traversing along the workpiece front side. However, as the workpiece front side is the functional surface, in an exemplary process the front side arm 24 finishes traversing the workpiece surface last and it is less important which of the arms starts first. Prior to either of the arms 24 and 28 traversing along the workpiece, the respective center wetting nozzle 32 and the edge wetting nozzle 30 begin spraying the workpiece with a rinsing fluid such as DI water. According to an exemplary embodiment, the rinsing fluid is heated above ambient temperature, up to about 40° C. Temperature may be automated using the controller 60. Each of the nozzles 32 and 30 continues to spray at least until it reaches a position at which it is no longer aimed at the workpiece.

For either of the arms 24 and 28, the respective tensioactive vapor spraying nozzle 34 is aimed toward the workpiece center and begins spraying and drying the center before the arm begins moving toward the workpiece edge. The tensioactive vapor spraying nozzle 34 continues to spray and dry the workpiece as the arm moves, with the DI water from the spraying nozzles 32 and 30 continually being forced off the workpiece edge. The first arm 24 reaches the wafer back side edge before the second arm reaches the wafer front side edge. After the first arm 28 reaches the workpiece edge and completes drying the back side, the edge drying nozzle 36 begins spraying tensioactive vapor onto the workpiece back side edge at a substantially perpendicular angle with respect to the workpiece surface, and continues to do so until the second arm 24 reaches the workpiece front side edge and completely dries the workpiece front side. Tensioactive vapor continues to be sprayed from the edge drying nozzle 36 to prevent the DI water from flowing off the workpiece back side edge and onto the workpiece front side.

According to an exemplary method, each of the arms 24 and 28 traverses along the workpiece at variable and independent rates, and at the same or different trajectories. For instance, in the method described above the first arm 28 begins moving along the workpiece back surface before the second arm 24 begins its movement, and the first arm 28 also completes its movement by reaching the workpiece edge before the second arm 24 reaches the workpiece edge. Each of the arms 24 and 28 may also traverse along the workpiece at a relatively fast or slow rate depending on its proximity to the workpiece edge. For example, according to one exemplary method each arm begins at the workpiece center, spraying tensioactive vapor thereon, and initially traverses at a very slow rate since the workpiece center experiences little to no acceleration force to cause sprayed DI water to flow toward the workpiece edge. After drying the workpiece center, the each arm continuously increases its rate of movement until it reaches a point at which the wetting nozzles 32 and 30 are no longer aimed at the workpiece and the workpiece is no longer being wet. Each arm then continues spraying tensioactive vapor onto the workpiece edge to overcome any surface tension force that causes the workpiece edge to stay wet longer than the immediate inward workpiece areas. The workpiece spinning rate may be constant according to this embodiment, while each arm automatically moves at independent and variable rates to optimize the cleaning procedure.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An apparatus for simultaneously rinsing and drying front and back surfaces of a workpiece, the apparatus comprising:
   a chuck adapted to spin the workpiece;
   a plurality of posts coupled to the chuck and adapted to support the workpiece;
   a first mechanical arm adapted to be positioned between the chuck and the workpiece, and to sweep along an arc between the workpiece center and the outer edge of the workpiece back surface, the first mechanical arm comprising:
   at least a first rinsing liquid nozzle, and
   a first tensioactive vapor nozzle; and
   a second mechanical arm adapted to be positioned adjacent to the workpiece front surface, and to sweep along at least part of the workpiece front surface, the second mechanical arm comprising:
   at least a second rinsing liquid nozzle, and
   a second tensioactive vapor nozzle.

2. The apparatus according to claim 1, further comprising:
   a third mechanical arm adapted and equipped to perform a cleaning process on the workpiece prior to rinsing and drying the workpiece using the first and second mechanical arms.

3. The apparatus according to claim 1, further comprising:
   a stationary third tensioactive vapor nozzle positioned to direct a tensioactive vapor toward a peripheral edge of the workpiece back surface.

4. The apparatus according to claim 3, wherein one or more of the first, second, and third tensioactive vapor nozzles are positioned to direct the tensioactive vapor in a direction substantially normal to the workpiece back surface.

5. The apparatus according to claim 1, wherein one or more of the first and second rinsing liquid nozzles are positioned to direct liquid toward the workpiece surface at a distribution angle between 5 and 45 degrees from the normal of the workpiece surface.

6. The apparatus according to claim 1, further comprising:
   a controller configured to separately control flow rates for each of the rinsing liquid nozzles.

7. The apparatus according to claim 1, further comprising:
   a controller configured to separately control liquid temperatures for rinsing liquids associated with each of the rinsing liquid nozzles.

8. The apparatus according to claim 1, further comprising:
   a controller configured to separately control flow rates for each of the tensioactive vapor nozzles.

9. The apparatus according to claim 1, further comprising:
   a controller configured to separately control movement of each of the first and second mechanical arms.

10. The apparatus according to claim 1, wherein the chuck comprises a cylindrical motor and a platen supported by the motor, the platen having the plurality of posts mounted thereon.

11. The apparatus according to claim 10, further comprising:
    a non-rotating post extending through the cylindrical motor; and
    a platform supported by the non-rotating post, and having at least the first mechanical arm supported thereon.

* * * * *